United States Patent
Hsu et al.

(10) Patent No.: US 7,473,150 B2
(45) Date of Patent: Jan. 6, 2009

(54) ZINC OXIDE N-I-N ELECTROLUMINESCENCE DEVICE

(75) Inventors: Sheng Teng Hsu, Camas, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 589 days.

(21) Appl. No.: 11/123,603

(22) Filed: May 6, 2005

(65) Prior Publication Data
US 2006/0250072 A1 Nov. 9, 2006

(51) Int. Cl.
*H01J 9/00* (2006.01)
*H01J 9/24* (2006.01)

(52) U.S. Cl. ............... 445/23; 445/35; 445/58; 313/498; 313/499; 313/503; 313/506; 257/82; 257/86; 257/94; 257/103

(58) Field of Classification Search ......... 313/498–499, 313/503, 506–509; 445/23, 35, 58; 257/79–103, 257/49–75
See application file for complete search history.

(56) References Cited
U.S. PATENT DOCUMENTS 4,279,001 A * 7/1981 Benz ..................... 348/198
2003/0015719 A1* 1/2003 Haga ..................... 257/82

* cited by examiner

*Primary Examiner*—Nimeshkumar D. Patel
*Assistant Examiner*—Thomas A Hollweg
(74) *Attorney, Agent, or Firm*—Law Office of Gerald Maliszewski; Gerald Maliszewski

(57) ABSTRACT

A method is provided for forming a ZnO Si N—I—N EL device. The method comprises: forming an n-doped Si layer; forming a Si oxide (SiO2) layer overlying the n-doped Si layer; forming an n-type ZnO layer overlying the SiO2 layer; and, forming an electrode overlying the ZnO layer. The electrode can be a transparent material such as indium tin oxide, zinc oxyfluoride, or a conductive plastic. The n-doped Si layer can be polycrystalline or single-crystal Si. In some aspects, the Si oxide layer has a thickness in the range of 1 to 20 nm. More preferably, the thickness is 2 to 5 nm. The ZnO layer thickness is in the range of 10 to 200 nm.

8 Claims, 3 Drawing Sheets

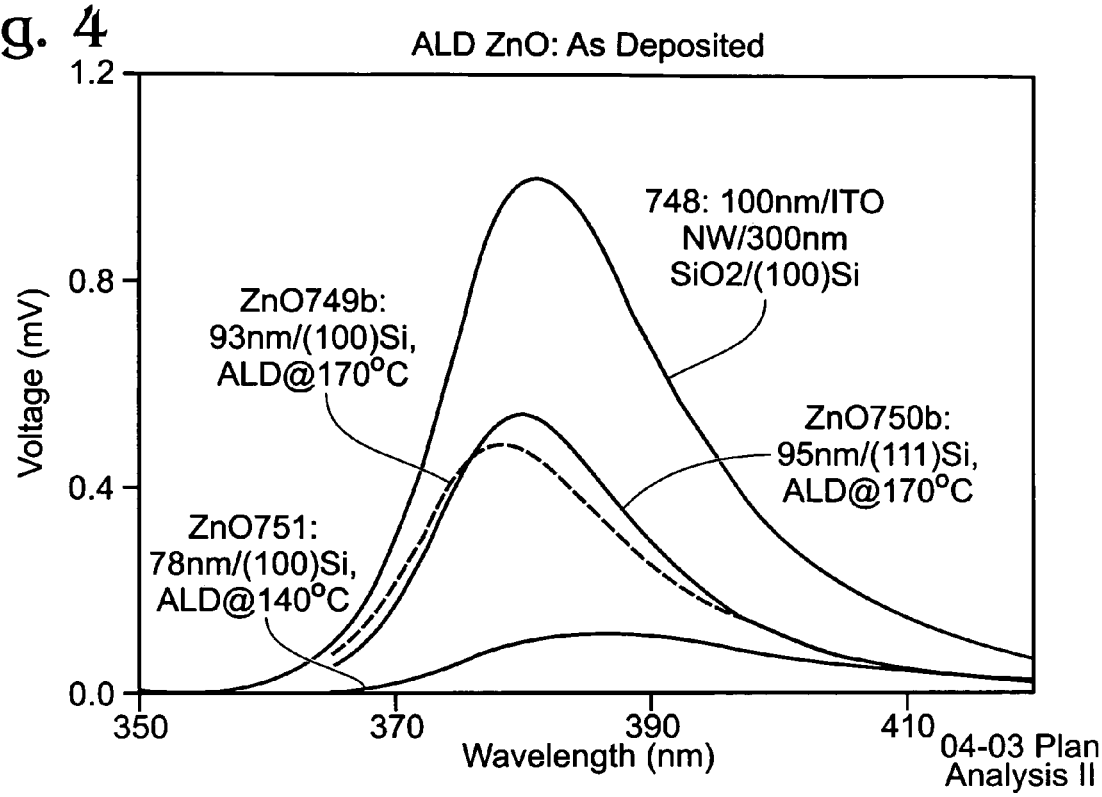
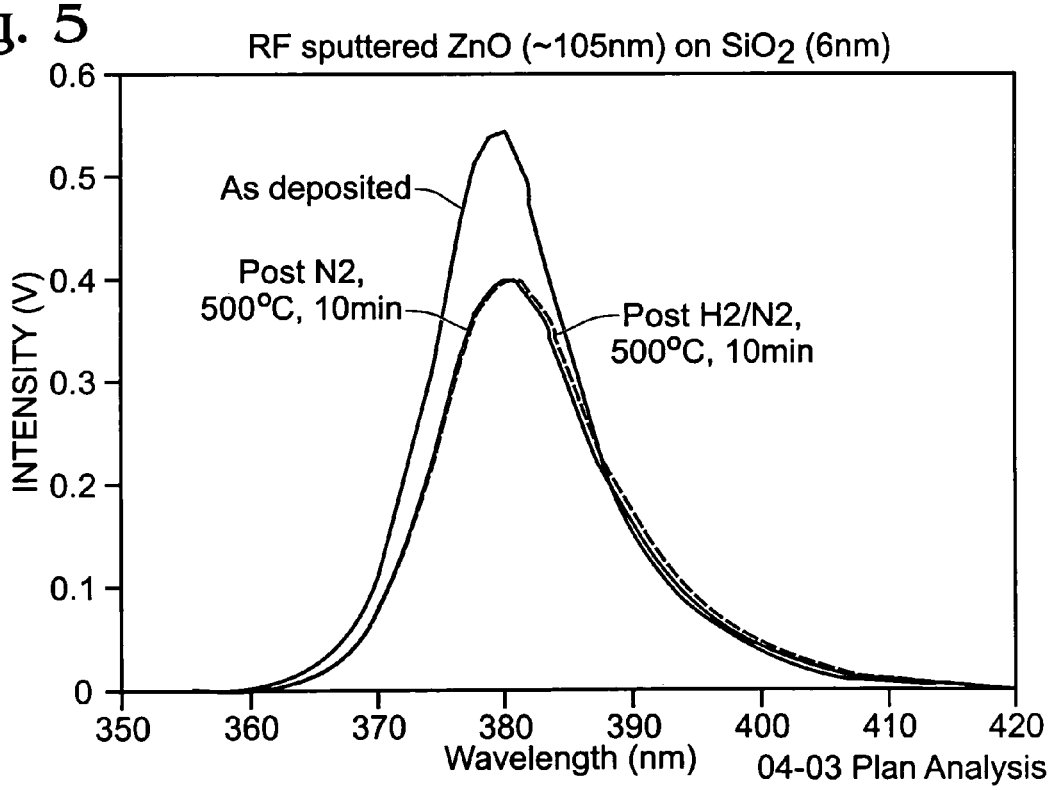

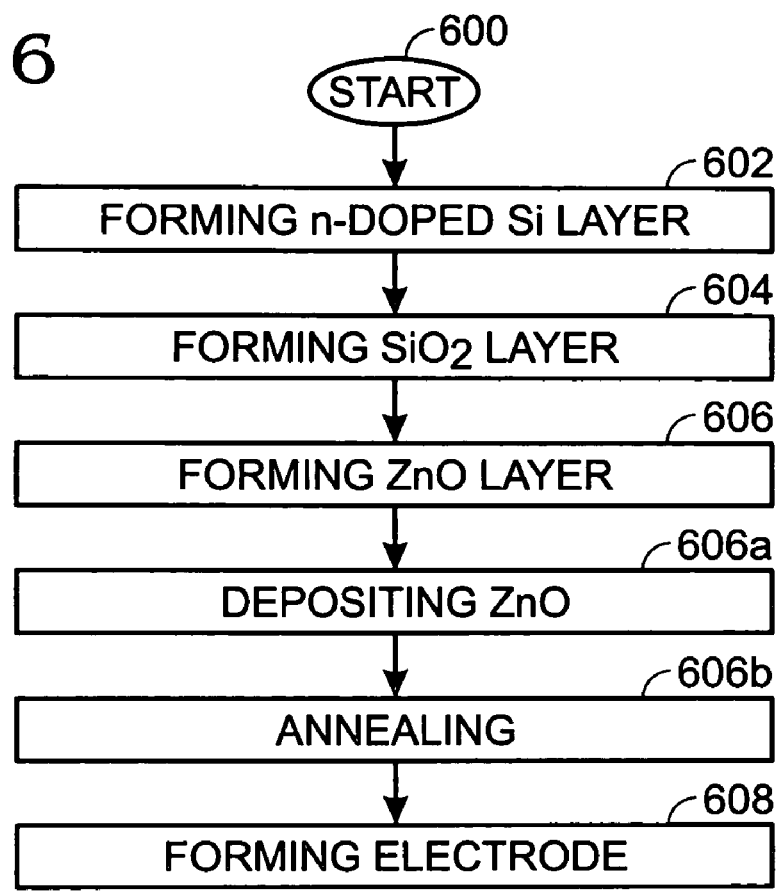
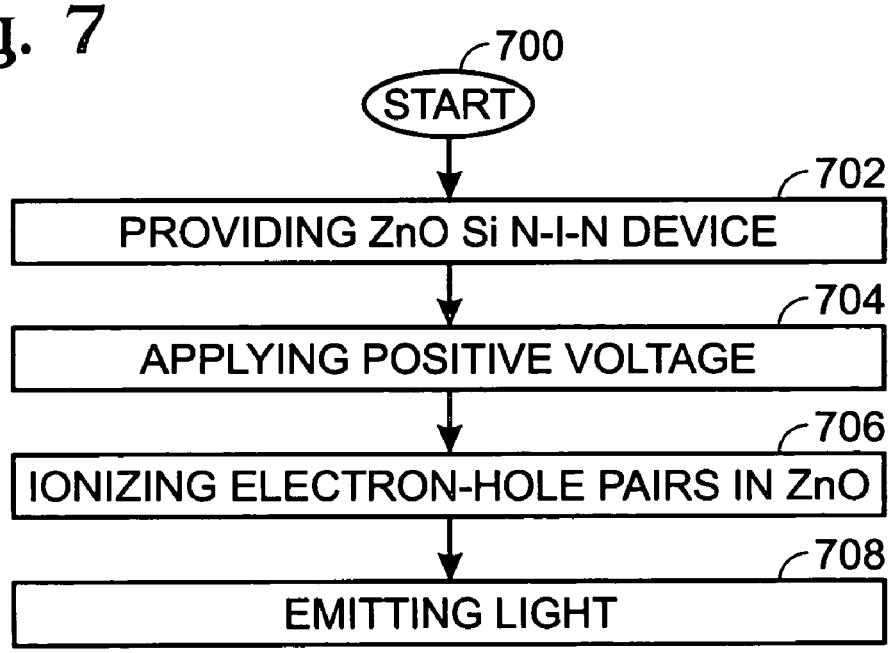

ZINC OXIDE N-I-N ELECTROLUMINESCENCE DEVICE

BACKGROUND OF THE INVENTION

1. Field of the Invention

This invention generally relates to integrated circuit (IC) fabrication and, more particularly, to a silicon-based n-type/insulator/n-type (N—I—N) electroluminescence (EL) device that emits light.

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals, at room temperature. However, these devices are fabricated on materials that are typically not compatible with silicon, for example type III-V materials such as InGaN, AlGaAs, GaAsP, GaN, and GaP. An EL device built on one of these substrates can efficiently emit light in a narrow bandwidth within the visible region, depending on the specific material used. Additionally, type II-VI materials such as ZnSe have been used. Other type II-VI materials such as ZnS and ZnO are known to exhibit electroluminescence under ac bias conditions. These devices can be deposited onto silicon for use in light generating devices if special (non-conventional) CMOS processes are performed. Other classes of light emitting devices are organic light emitting diodes (OLEDs), nanocrystalline silicon (nc-Si), and polymer LEDs.

Silicon has conventionally been considered unsuitable for optoelectronic applications, due to the indirect nature of its energy band gap. Bulk silicon is indeed a highly inefficient light emitter. Among the different approaches developed to overcome this problem, quantum confinement in Si nanostructures and rare earth doping of crystalline silicon have received a great deal of attention. In particular, Si nanoclusters (nc) embedded in $SiO_2$ have in recent years attracted the interest of the scientific community as a promising new material for the fabrication of a visible Si-based light source. Alternatively, Er-doped crystalline Si has been extensively studied to take advantage of the radiative intra-4f shell Er transition. Room-temperature operating devices with efficiencies of around 0.05% have been achieved. The device efficiency is very low and the process temperature is very high, normally over 1100° C.

Generally, although there are many types of solid-state electroluminescence devices available, these devices have not proved suitable for silicon IC interconnect applications, as they are not compatible with silicon material, have too large of an operating voltage, or too low of a light generation efficiency. A simple and efficient light-emitting device compatible with silicon, and powered by a dc voltage would be desirable in applications where photonic devices (light emitting and light detecting) are necessary. Efficient silicon substrate EL devices would enable a faster and more reliable means of signal coupling, as compared with conventional metallization processes. Further, for intra-chip connections on large system-on-chip type of devices, the routing of signals by optical means is also desirable. For inter-chip communications, waveguides or direct optical coupling between separate silicon pieces would enable packaging without electrical contacts between chips. For miniature displays, a method for generating small point sources of visible light would enable simple, inexpensive displays to be formed.

It would be advantageous if a Si-based EL device could be fabricated that had a larger bandgap then a device made from a Si phosphor.

SUMMARY OF THE INVENTION

A silicon/oxide/ZnO electroluminescence device is presented as a voltage driven, light emission device for IC interconnect applications. This device has an advantage of large process tolerances, as compared to nanocrystalline-embedded silicon oxide. The output is confined to the energy of the ZnO bandgap of 3.3eV (376 nanometers (nm)), which is higher than that for nanocrystal silicon.

More specifically, the electroluminescence device is a stack of indium tin oxide (InSnO or ITO) on ZnO, on silicon oxide, on n-type silicon. The ZnO may be deposited by either a sputtering process, spin-on deposition, or by a Chemical Vapor Deposition (CVD) process, followed by high temperature annealing. When a positive voltage is biased to the ITO electrode, high-energy electrons are injected through oxide, causing impact ionization in the ZnO and generating electron-hole pairs. The generated holes recombine with electrons and emit light.

Accordingly, a method is provided for forming a ZnO Si N—I—N EL device. The method comprises: forming an n-doped Si layer; forming a Si oxide (SiO2) layer overlying the n-doped Si layer; forming an n-type ZnO layer overlying the SiO2 layer; and, forming an electrode overlying the ZnO layer. The electrode can be a transparent material such as indium tin oxide, zinc oxyfluoride, or a conductive plastic. The n-doped Si layer can be polycrystalline or single-crystal Si. In some aspects, the Si oxide layer has a thickness in the range of 1 to 20 nm. More preferably, the thickness is 2 to 5 nm. The ZnO layer thickness is in the range of 10 to 200 nm.

Additional details of the above-described method, a ZnO N—I—N EL device, and a method for operating such as device are described below.

BRIEF DESCRIPTION OF THE DRAWINGS

FIGS. 4 and 5 depict the photoluminescence spectrum of devices formed from low temperature ALD and sputtering deposited ZnO, respectively.

FIG. 6 is a flowchart illustrating a method for forming a ZnO silicon oxide n-Si N—I—N EL device.

FIG. 7 is a flowchart illustrating a method for emitting light using a ZnO Si N—I—N EL device.

DETAILED DESCRIPTION

Figure 1:
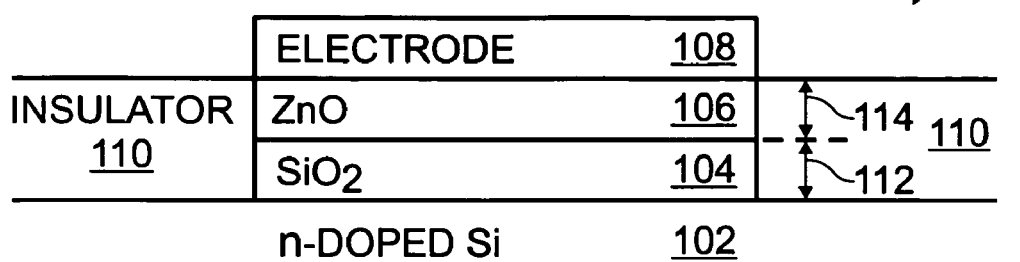
FIG. 1 is a partial cross-sectional view of a zinc oxide (ZnO) silicon (Si) n-type/insulator/n-type (N—I—N) electroluminescence (EL) device.

FIG. 1 is a partial cross-sectional view of a zinc oxide (ZnO) silicon (Si) n-type/insulator/n-type (N—I—N) electroluminescence (EL) device. The device 100 comprises an n-doped Si layer 102 and a Si oxide (SiO2) layer 104 overlying the n-doped Si layer 102. An n-type ZnO layer 106 overlies the SiO2 layer 104. An electrode 108 overlies the ZnO layer 106.

The electrode 108 can be a material such as indium tin oxide (ITO), zinc oxyfluoride, or a conductive plastic. However, this is not an exhaustive list of materials. In other aspects, the electrode 108 can be a thin (transparent) metal such as gold (Au), aluminum (Al), or chromium (Cr). In other aspects, the electrode 108 need not be transparent and light is emitted through the insulator 110. In addition to the transparent materials mentioned above, the electrode 108 can a material such as polycrystalline Si, Pt, Ir, Al, AlCu, Au, Ag, YBCO, ITO, $RuO_2$, or $La_{1-x}Sr_xCoO_3$.

Typically, the n-doped Si layer 102 is polycrystalline or single-crystal Si. It is also typical that the SiO2 layer 104 has a thickness 112 in the range of 1 to 20 nanometers (nm). More preferably, the SiO2 layer thickness 112 is in the range of 2 to 5 nm. The ZnO layer 106 has a thickness 114 in the range of 10 to 200 nm.

Functional Description

The device is a simple stack of n-Si/$SiO_2$/ZnO structure. The ZnO is n-type. This structure is much different from the conventional light emitting diode, which requires a p-n junction. The n-type silicon is either n-doped single crystalline silicon or polycrystalline silicon. The thickness of $SiO_2$ is in the range of 1 nm to 20 nm, preferably in the sub-range of 2 nm to 5 nm. The thickness of ZnO is in the range of 10 nm to 200 nm. A thin layer of ITO may be deposited onto ZnO to provide an electrical contact.

Figure 2:
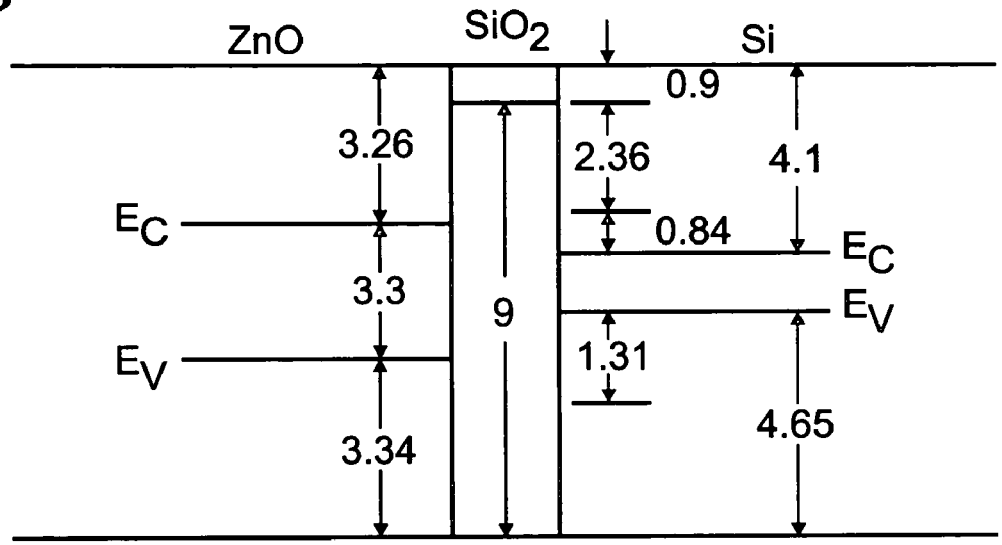
FIG. 2 is a device energy diagram.

FIG. 2 is a device energy diagram. The energy barriers for electrons and holes in silicon are about 3.2eV and 4.65eV, respectively. The energy barriers for electrons and holes in ZnO are 2.36eV and 3.34eV, respectively. When a positive voltage is applied to ZnO, some of the electrons in the n-type silicon are activated. These electrons are able to tunnel through $SiO_2$, into the ZnO. The resulting impact ionization produces electron-hole pairs in ZnO. Since the energy barrier of holes in ZnO is about 0.14eV larger than the energy barrier of electrons in n-type silicon, the probability for holes injection from ZnO into n-type silicon is very small, as compared to electron injection from n-type silicon into ZnO. The hole current is negligibly small as compared to the electron current.

Figure 3:
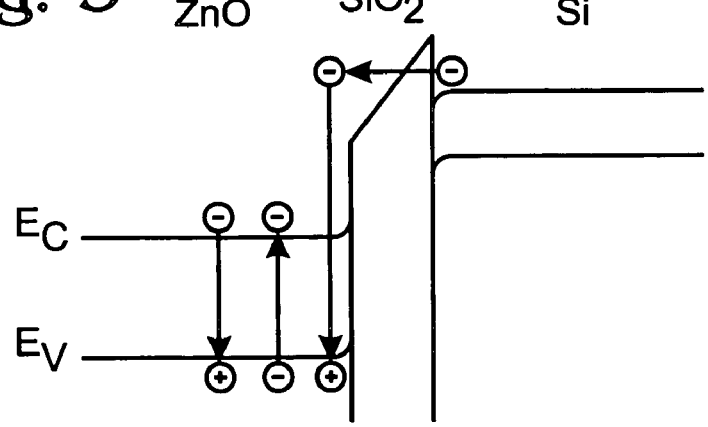
FIG. 3 is an energy diagram depicting the subsequence of electron/hole recombination.

FIG. 3 is an energy diagram depicting the subsequence of electron/hole recombination. Since the hole current is very small, and only higher energy electrons are able to inject through the oxide barrier, higher light emission efficiencies are possible.

When the ZnO is biased with a negative voltage, electrons flow from ZnO through the oxide barrier into n-type silicon. Since ZnO has a smaller electron barrier, the current is larger than the positive bias condition for the same bias voltage. Electrons flowing from ZnO into n-type silicon also may cause impact ionization. However, silicon is not a direct band structure material. Therefore, no light emission is possible in this bias condition.

FIGS. 4 and 5 depict the photoluminescence spectrum of devices formed from low temperature ALD and sputtering deposited ZnO, respectively. ZnO has a large photoresponse at a wavelength of 375 nm.

FIG. 6 is a flowchart illustrating a method for forming a ZnO silicon oxide n-Si N—I—N EL device. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 forms an n-doped Si layer. Step 604 forms a Si oxide (SiO2) layer overlying the n-doped Si layer. Step 606 forms an n-type ZnO layer overlying the SiO2 layer. Step 608 forms an electrode overlying the ZnO layer.

Forming the electrode in Step 608 may include forming the electrode from a material such as ITO, zinc oxyfluoride, or conductive plastics. However, other materials may also be used. Forming the n-doped Si layer in Step 602 includes forming a Si layer from a material such as polycrystalline or single-crystal Si.

In one aspect, forming the ZnO layer in Step 606 includes substeps. Step 606a deposits ZnO using one of the following processes: sputtering, spin-on deposition, Metal-Organic Chemical Vapor Deposition (MOCVD), Chemical Vapor Deposition (CVD), or Atomic Layer Deposition (ALD). Those skilled in the art would understand how to deposit ZnO using these processes. Step 606b, following the deposition, anneals at a high temperature.

In another aspect, forming the SiO2 layer in Step 604 includes forming the Si oxide layer with a thickness in the range of 1 to 20 nanometers (nm). In a different aspect, the SiO2 thickness is in the range of 2 to 5 nm. Forming the ZnO layer is Step 606 typically includes forming the ZnO layer with a thickness in the range of 10 to 200 nm.

FIG. 7 is a flowchart illustrating a method for emitting light using a ZnO Si N—I—N EL device. The method starts at Step 700. Step 702 supplies an N—I—N EL device comprising an n-doped Si layer, a Si oxide (SiO2) layer overlying the n-doped Si layer, an n-type ZnO layer overlying the SiO2 layer; and an electrode overlying the ZnO. Step 704 applies a positive voltage to the electrode, respective to the n-doped Si layer. Step 706 ionizes electron-hole pairs in the ZnO layer. Step 708 emits light.

In one aspect, ionizing electron-hole pairs in the ZnO layer in Step 706 includes tunneling electrons from the n-type Si into the ZnO layer.

In another aspect, the light emitted in Step 708 is about 375 nm. However, process variations permit the light emissions to be optimized for other wavelengths. Typically, applying the positive voltage to the electrode in Step 704 includes applying a voltage in the range of 3V to 15V.

A ZnO N—I—N EL device and a fabrication process have been provided. A few examples of specific materials, environmental conditions, and temperatures have been given to illustrate the invention. However, the invention is not limited to merely these examples. Other variations and embodiments will occur to those skilled in the art.

We claim:

1. A method for forming a zinc oxide (ZnO) silicon (Si) n-type/insulator/n-type (N—I—N) electroluminescence (EL) device, the method comprising:
   forming an n-doped Si layer;
   forming a Si oxide (SiO2) layer overlying the n-doped Si layer; and
   forming an n-type ZnO layer overlying the SiO2 layer.

2. The method of claim 1 further comprising:
   forming an electrode overlying the ZnO layer.

3. The method of claim 2 wherein forming the electrode includes forming the electrode from a material selected from the group comprising indium tin oxide (ITO), zinc oxyfluoride, and conductive plastics.

4. The method of claim 1 wherein forming the ZnO layer includes:

depositing ZnO using a process selected from the group comprising sputtering, spin-on deposition, Metal-Organic Chemical Vapor Deposition (MOCVD), Chemical Vapor Deposition (CVD), and Atomic Layer Deposition (ALD); and annealing.

5. The method of claim 1 wherein forming the n-doped Si layer includes forming a Si layer selected from the group including polycrystalline and single-crystal Si.

6. The method of claim 1 wherein forming the SiO2 layer includes forming the Si oxide layer with a thickness in the range of 1 to 20 nanometers (nm).

7. The method of claim 6 wherein forming the SiO2 layer includes forming the Si oxide layer with a thickness in the range of 2 to 5 nm.

8. The method of claim 1 wherein forming the ZnO layer includes forming the ZnO layer with a thickness in the range of 10 to 200 nm.

* * * * *